United States Patent
Yan et al.

(10) Patent No.: US 9,391,208 B2
(45) Date of Patent: Jul. 12, 2016

(54) ELECTRONIC DEVICE AND METHOD OF MANUFACTURING THE SAME

(71) Applicant: Industrial Technology Research Institute, Chutung, Hsinchu County (TW)

(72) Inventors: Jing-Yi Yan, Chutung (TW); Wu-Wei Tsai, Chutung (TW); Wei-Cheng Kao, Chutung (TW); Wei-Han Chen, Chutung (TW)

(73) Assignee: Industrial Technology Research Institute, Chutung, Hsinchu County (TW)

( * ) Notice: Subject to any disclaimer, the term of this patent is extended or adjusted under 35 U.S.C. 154(b) by 0 days.

(21) Appl. No.: 14/517,065

(22) Filed: Oct. 17, 2014

(65) Prior Publication Data

US 2016/0111551 A1    Apr. 21, 2016

(51) Int. Cl.
*H01L 27/12* (2006.01)
*H01L 29/786* (2006.01)
*H01L 29/66* (2006.01)
*H01L 23/538* (2006.01)

(52) U.S. Cl.
CPC ...... *H01L 29/78606* (2013.01); *H01L 23/5387* (2013.01); *H01L 27/1218* (2013.01); *H01L 27/1222* (2013.01); *H01L 27/1248* (2013.01); *H01L 27/1259* (2013.01); *H01L 29/66742* (2013.01); *H01L 29/78603* (2013.01)

(58) Field of Classification Search
CPC ............ H01L 29/78606; H01L 29/78603; H01L 27/1218; H01L 27/1259; H01L 27/1222; H01L 23/5387; H01L 29/66742; H01L 27/1248
See application file for complete search history.

(56) References Cited

U.S. PATENT DOCUMENTS

| 7,943,932 B2 | 5/2011 | Park et al. |
| 8,179,489 B2 | 5/2012 | Jung et al. |
| 2002/0013554 A1 | 1/2002 | Heinz et al. |

(Continued)

FOREIGN PATENT DOCUMENTS

| TW | 200606487 | 2/2006 |
| TW | I376556 B | 11/2012 |

OTHER PUBLICATIONS

Bonfilglio et al., "A completely flexible organic transistor obtained by a one-mask photolithographic process," *Appl. Phys. Letts.*, 82(20):3550-3552 (2003).

(Continued)

*Primary Examiner* — Roy Potter
*Assistant Examiner* — Paul Patton
(74) *Attorney, Agent, or Firm* — McCarter & English, LLP; Yu Lu

(57) ABSTRACT

An electronic device including at least one electronic component and a method of manufacturing the same are provided. The electronic device may include a substrate, a semiconductor layer disposed on the substrate, an insulating layer disposed on the semiconductor layer, and a first metal layer disposed on the insulating layer. The insulating layer may have a pattern corresponding to a pattern of the semiconductor layer or the first metal layer. The flexible layer has a Young's modulus less than 40 GPa and is disposed on the substrate to encapsulate the semiconductor layer. At least one first opening penetrates the flexible layer. At least one second metal layer is disposed on the flexible layer and in the first opening and electrically connected to the semiconductor layer.

26 Claims, 13 Drawing Sheets

(56) References Cited

U.S. PATENT DOCUMENTS

| | | | |
|---|---|---|---|
| 2003/0016311 | A1 | 1/2003 | Sato et al. |
| 2004/0149987 | A1 | 8/2004 | Kim et al. |
| 2006/0255338 | A1* | 11/2006 | Jeong ............... H01L 29/66757 257/66 |
| 2008/0105873 | A1 | 5/2008 | Wang et al. |
| 2008/0105877 | A1 | 5/2008 | Yamazaki et al. |
| 2010/0096654 | A1 | 4/2010 | Godo |
| 2010/0270556 | A1 | 10/2010 | Wang et al. |
| 2010/0283054 | A1* | 11/2010 | Hirano ............... H01L 29/78603 257/57 |
| 2014/0078458 | A1 | 3/2014 | Fukushima |
| 2014/0231811 | A1 | 8/2014 | Yan et al. |
| 2015/0241744 | A1 | 8/2015 | Nakata et al. |

OTHER PUBLICATIONS

Braga and Horowitz, "High-Performance Organic Field-Effect Transistors," *Adv. Mater.*, 21:1473-1486 (2009).

Jang et al., "High Tg cyclic olefin copolymer/$Al_2O_3$ bilayer gate dielectrics for flexible organic complementary circuits with low-voltage and air-stable operation," *J. Mater. Chem.*, 21:12542-12546 (2011).

Seol et al., "Mechanically flexible low-leakage multilayer gate dielectrics for flexible organic thin film transistors," *Appl. Phys. Letts.*, 93:013305-1-013305-3 (2008).

Wang et al., "Low power flexible organic thin film transistors with amorphous $Ba_{0.7}Sr_{0.3}TiO_3$ gate dielectric grown by pulsed laser deposition at low temperature," *Org. Electr.*, 13:1223-1228 (2012).

Yang et al., "Environmentally Stable Transparent Organic/Oxide Hybrid Transistor Based on an Oxide Semiconductor and a Polyimide Gate Insulator," *IEEE Electr. Device Letts.*, 31(5):446-448 (2010).

English abstract of TW I376556.

Office Action issued Feb. 18, 2016 in TW 103118367.

TW 200606487 English abstract.

Office Action issued May 10, 2016 in TW 103136754.

\* cited by examiner

US 9,391,208 B2

ELECTRONIC DEVICE AND METHOD OF MANUFACTURING THE SAME

BACKGROUND OF THE INVENTION

1. Technical Field Disclosure

The present disclosure relates to electronic device and a method of manufacturing the same.

2. Description of Related Art

Flexible circuits are designated in various circumstances, in where flexibility, space savings, or production constraints limit the serviceability of rigid circuit boards or hand wiring.

Therefore, many flexible electronic devices utilize inorganic materials for the manufacture of electronic components.

SUMMARY OF THE INVENTION

An embodiment of the present disclosure provides an electronic device including at least one electronic component, comprising: a substrate; a semiconductor layer disposed on the substrate; an insulating layer disposed on the semiconductor layer; a first metal layer disposed on the insulating layer, wherein the insulating layer and the first metal layer have corresponding patterns; a flexible layer disposed on the substrate and encapsulate the semiconductor layer, the insulating layer and the first metal layer, wherein the flexible layer has a Young's modulus less than 40 GPa; at least one first opening penetrating the flexible layer; and at least one second metal layer disposed on the flexible layer and in the first opening to electrically connect the semiconductor layer.

An embodiment of the present disclosure also provides an electronic device including at least one electronic component, comprising a substrate; a semiconductor layer disposed on the substrate; an insulating layer disposed on the semiconductor layer, wherein the semiconductor layer and the insulating layer have corresponding patterns; a first metal layer disposed on the insulating layer; a flexible layer disposed on the substrate and encapsulate the semiconductor layer, the insulating layer and the first metal layer, wherein the flexible layer has a Young's modulus less than 40 GPa; at least one first opening penetrating the flexible layer and the insulating layer; and at least one second metal layer disposed on the flexible layer and in the first opening to electrically connect the semiconductor layer.

An embodiment of the present disclosure further provides a method of manufacturing an electronic device including at least one electronic component, comprising: forming a semiconductor layer on a substrate; forming an insulating layer on the semiconductor layer; forming a first metal layer on the insulating layer; performing a patterning process such that the insulating layer has a pattern corresponding to a pattern of one of the first metal layer and the semiconductor layer; forming a flexible layer on the substrate to encapsulate the semiconductor layer, the insulating layer and the first metal layer, wherein the flexible layer has a Young's modulus less than 40 GPa; forming at least one first opening penetrating the flexible layer and exposing a portion of the semiconductor layer; and forming at least one second metal layer on the flexible layer and in the first opening to electrically connect the semiconductor layer.

BRIEF DESCRIPTION OF THE DRAWINGS

The present disclosure can be more fully understood by reading the following detailed description of the exemplary embodiments, with reference made to the accompanying drawings.

FIGS. 1A to 1G illustrate sectional views of an embodiment of a method of manufacturing an electronic device according to the present disclosure, wherein FIGS. 1D and 1E illustrate two alternative processes of FIG. 1C.

FIGS. 2A to 2H illustrate sectional views of another embodiment of a method of manufacturing an electronic device according to the present disclosure, wherein FIG. 2F illustrates an alternative process of FIG. 2E.

FIGS. 3A to 3H illustrate sectional views of an embodiment of a method of manufacturing an electronic device according to the present disclosure, wherein FIGS. 3E and 3F illustrate two alternative processes of FIG. 3D.

FIGS. 4A to 4H illustrate sectional views of another embodiment of a method of manufacturing an electronic device according to the present disclosure, wherein FIG. 4F illustrates an alternative process of FIG. 4E.

DETAILED DESCRIPTION OF THE INVENTION

Figure 1A:
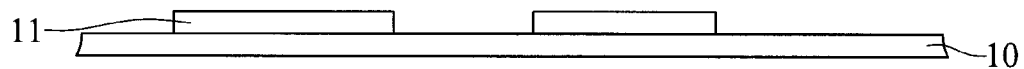

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing. The present disclosure provides a method of manufacturing an electronic device including at least one electronic component. As shown in FIGS. 1A-1G, an embodiment of the method of manufacturing an electronic device according to the present disclosure is provided with a sectional view. FIGS. 1H, 1I and 1J illustrates different embodiments of FIG. 1G. In this embodiment, for example, four photo engraving processes (PEPs) are performed.

Figure 1B:
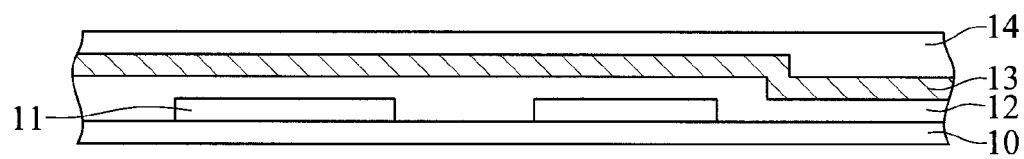

As shown in FIG. 1A, a semiconductor layer 11 is formed on a substrate 10, and the semiconductor layer 11 is patterned through a first photo engraving process (PEP1). Optionally, a buffer layer (not shown) may be formed between the substrate 10 and the semiconductor layer 11 according to the needs. As shown in FIG. 1B, an insulating layer 12 and a first metal layer 13 are formed on the semiconductor layer 11 and the substrate 10. Optionally, a protection layer 14 is further formed on the first metal layer 13. In an embodiment, the protection layer 14 is not necessary, and thus can be omitted. For example, if a back channel etching process is performed, the protection layer 14 may not be formed. On the other hand, if a channel protect layer structure is designated, the protection layer 14 may be formed. The protection layer 14 may be made of dielectric oxide, nitride, or carbide material system, such as SiOx, SiNx, SiCO, AlOx or TiOx. Alternately, the protection layer 14 may be a multi-layer stack structure constructed by the aforesaid dielectric materials.

In an embodiment, the semiconductor layer 11, the insulating layer 12, the first metal layer 13, and the protection layer 14 may be formed by a deposition or a coating process.

In an embodiment, the semiconductor layer 11 may be made of silicon based materials, such as amorphous-Si, polycrystalline silicon, or oxide semiconductor (for example, InGaZnO (IGZO) system, InSnO (ITO) system, InZnO (IZO) system, or InSnZnO (ITZO) system). The semiconductor layer 11 may also be made of other semiconductor system containing oxygen, or organic semiconductor, such as pentacene, poly(3-hexyl thiophene) (P3HT), and the like. The insulating layer 12 may be made of insulating materials such as SiOx, SiNx, SiON, or other suitable insulating materials. Alternately, the insulating layer 12 may be a multi-layer stack structure constructed by the aforesaid insulating materials. The first metal layer 13 may be made of conductive materials, such as Mo, Al, Ti, Cu, or alloy materials thereof. Alternately, the first metal layer 13 may be a multi-layer stack structure constructed by the conductive materials.

Figure 1C:
Figure 1D:
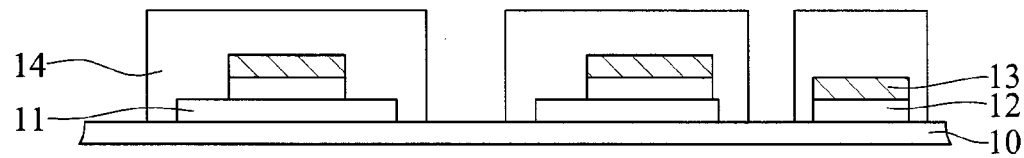
Figure 1E:
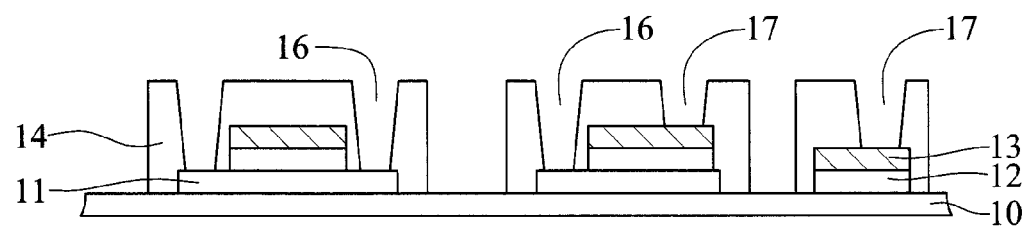

As shown in FIG. 1C, the insulating layer 12, the first metal layer 13 and the protection layer 14 are patterned through a second photo engraving process (PEP2), such that the insulating layer 12, the first metal layer 13 and the protection layer 14 have corresponding (e.g., the same) patterns. In an embodiment, the semiconductor layer 11 has a region larger than a region of the first metal layer 13.

Figure 1F:
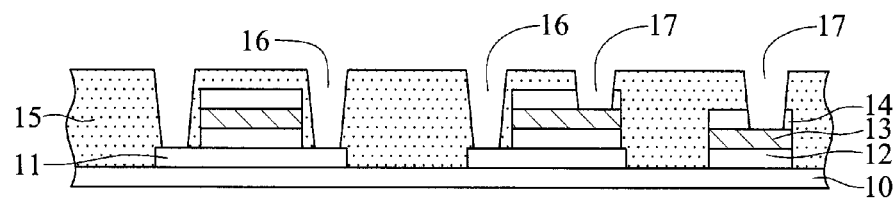

As shown in FIG. 1F, a flexible layer 15 is formed on the substrate 10 and patterned through a third photo engraving process (PEP3), so as to encapsulate the semiconductor layer 11, the insulating layer 12, the first metal layer 13, and the protection layer 14. In an embodiment, the flexible layer 15 has a Young's modulus less than 40 GPa. At least one first opening 16 is formed to penetrate the flexible layer 15, such that a portion of the semiconductor layer 11 is exposed. In an embodiment, at least one second opening 17 is formed to penetrate the flexible layer 15 and the protection layer 14, such that a portion of the first metal layer 13 is exposed. The flexible layer 15 may be formed by material such as organic material system (e.g., polyimide or the likes) or spin-on-glass (SOG) system.

Figure 1G:
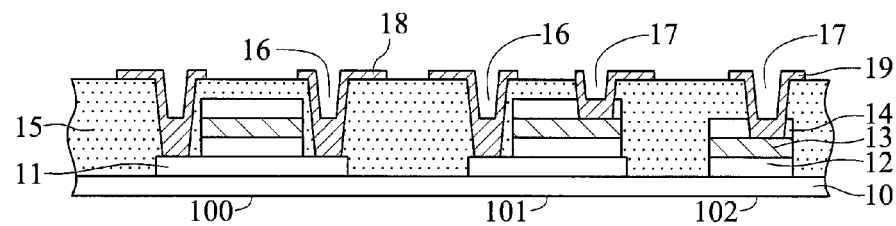
Figure 1H:
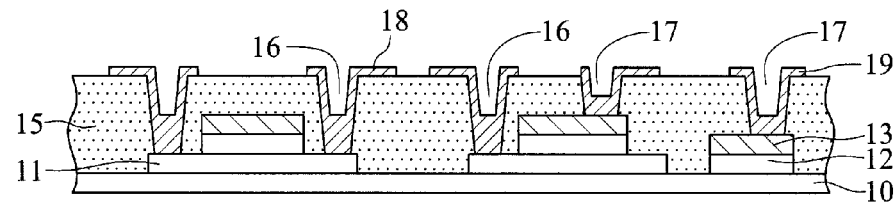
FIGS. 1H to 1J are sectional views of variations of the electronic device shown in FIG. 1G.
Figure 1I:
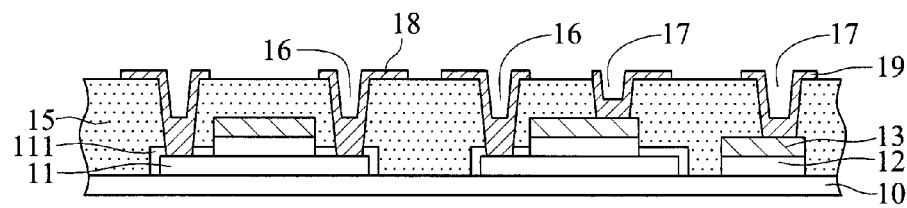
Figure 1J:
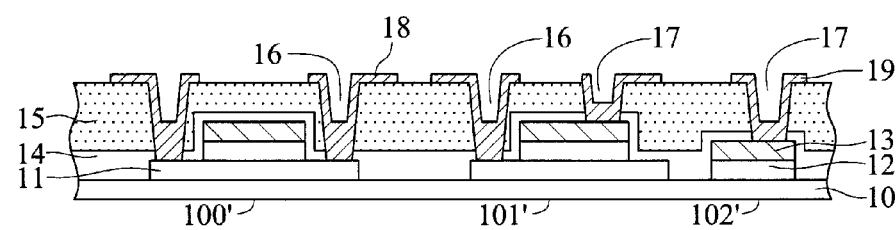

As shown in FIG. 1G, at least one second metal layer 18 is formed on the flexible layer 15 and in the first opening 16 and at least one third metal layer 19 is formed on the flexible layer 15 and in the second opening 17 through a fourth photo engraving process (PEP4), so as to electrically connect the semiconductor layer 11 and the first metal layer 13, respectively. In an embodiment, the second metal layer 18 and the third metal layer 19 may be formed by a deposition or a coating process. In this embodiment, an electronic device having a top-gate thin film transistor (TFT) 100 on the left, a capacitor structure 101 on the middle, and a contact via 102 is manufactured.

In another embodiment, as shown in FIG. 1H, if the subsequent process will not influence the first metal layer 13, the protection layer 14 can be omitted.

In a further embodiment, as shown in FIG. 1I, after the PEP2 illustrated in FIG. 1C is performed, a surface treatment layer 111 is further formed on a portion of the semiconductor layer 11 that is not covered by the insulating layer 12. The surface treatment layer 111 may be formed by $N_2O$ plasma, $O_3$ gas treatment, ozone water, thermal annealing, or a combination thereof. Also, the surface treatment layer 111 is further penetrated by the first opening 16.

In a further embodiment, as show in FIG. 1J, the protection layer 14 is formed after the PEP2 illustrated in FIG. 1C is performed, such that the protection layer 14 encapsulates the semiconductor layer 11, the insulating layer 12, and the first metal layer 13. In this embodiment, the first opening 16 further penetrates the protection layer 14. Since the protection layer 14 is not patterned with the insulating layer 12 and the first metal layer 13 in PEP2, an additional PEP3 for the protection layer 14 is performed, as shown in FIG. 1D. Therefore, this embodiment includes five photo engraving processes. Optionally, the first opening 16 and the second opening 17 may be formed while patterning the protection layer 14 in the additional PEP3, as shown in FIG. 1E. In this embodiment, an electronic device having a top-gate thin film transistor (TFT) 100' on the left, a capacitor structure 101' on the middle, and a contact via 102' is manufactured, where the protection layer 14 may encapsulate one or more electronic components, such as the top-gate TFT 100' or the capacitor structure 101' and the likes.

As shown in FIGS. 2A-2H, another embodiment of the method of manufacturing an electronic device according to the present disclosure is provided with sectional views. In this embodiment, for example, six PEPs are performed.

Figure 2A:
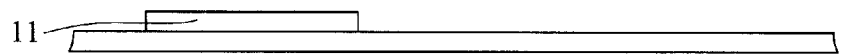

As shown in FIG. 2A, a semiconductor layer 11 is formed on a substrate 10, and the semiconductor layer 11 is patterned through PEP1, such that the semiconductor layer 11 is disposed on a left portion of the substrate 10, for example.

Figure 2B:

As shown in FIG. 2B, an insulating layer 12 and a first metal layer 13 are formed on the semiconductor layer 11 and the substrate 10.

Figure 2C:
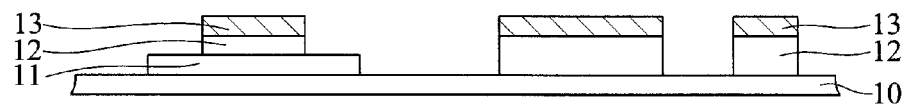

As shown in FIG. 2C, the insulating layer 12 and the first metal layer 13 are patterned through PEP2, such that the insulating layer 12 and the first metal layer 13 have corresponding patterns.

Figure 2D:
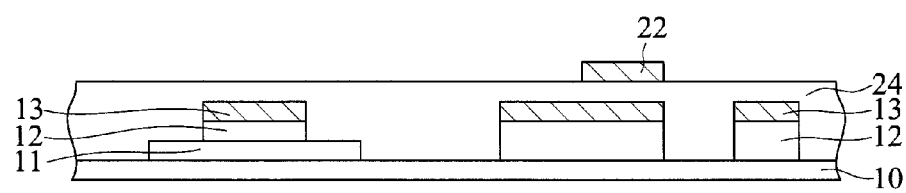

As shown in FIG. 2D, a first protection layer 24 is formed to encapsulate the semiconductor layer 11, the insulating layer 12, and the first metal layer 13. A fourth metal layer 22 is formed on the first protection layer 24 and is patterned through PEP3. In an embodiment, the patterned fourth metal layer 22 is above a middle portion of the substrate 10 where the semiconductor layer 11 is not formed thereon, so as to construct, for example, a capacitor structure.

Figure 2E:
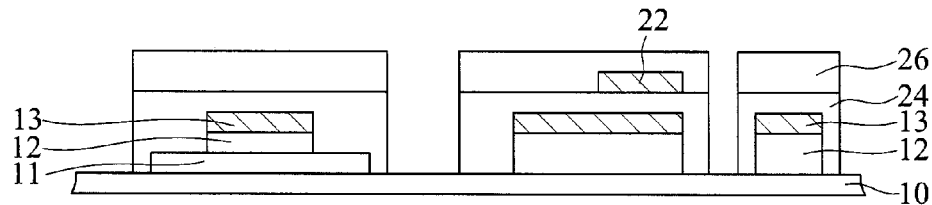
Figure 2F:
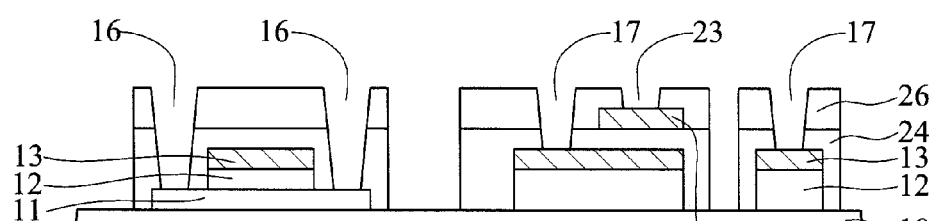

As shown in FIG. 2E, a second protection layer 26 is formed on the first protection layer 24 to encapsulate the fourth metal layer 22. The first protection layer 24 and the second protection layer 26 are patterned through PEP4. Optionally, at least one first opening 16, at least one second opening 17, and at least one third opening 23 may be formed in the PEP4, so as to expose a portion of the semiconductor layer 11, the first metal layer 13 and the fourth metal layer 22, respectively (see FIG. 2F). In an embodiment, the first opening 16, the second opening 17, and the third opening 23 may be formed in a subsequent process.

Figure 2G:
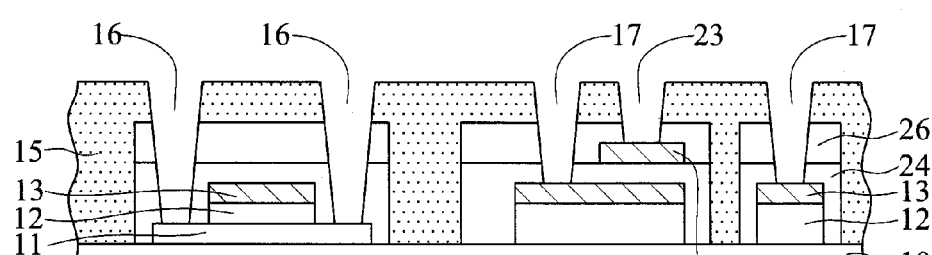

As shown in FIG. 2G, a flexible layer 15 is formed on the substrate 10 and is patterned through PEP5. If the first opening 16, the second opening 17, and the third opening 23 are not formed in the PEP4, may be formed in the PEP5, so as to expose a portion of the semiconductor layer 11, the first metal layer 13 and the fourth metal layer 22, respectively.

Figure 2H:
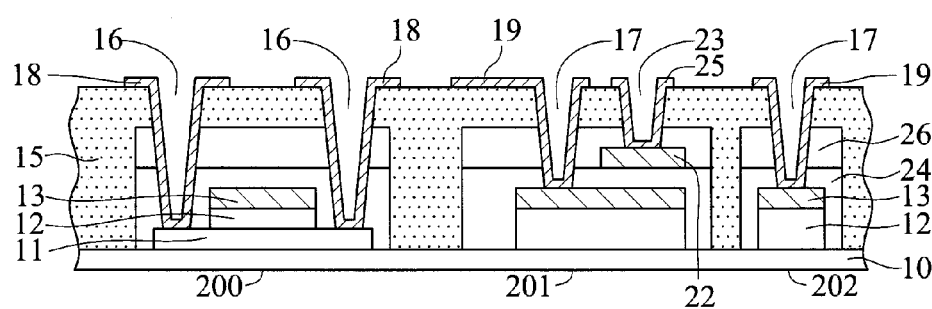

As shown in FIG. 2H, at least one second metal layer 18 is formed on the flexible layer 15 and in the first opening 16, at least one third metal layer 19 is formed on the flexible layer 15 and in the second opening 17, and at least one fifth metal layer 25 is formed on the flexible layer 15 and in the third opening 23 through a sixth photo engraving process (PEP6), so as to electrically connect the semiconductor layer 11, the first metal layer 13, and the fourth metal layer 22, respectively. In this embodiment, an electronic device having a top-gate thin film transistor (TFT) 200 on the left, a capacitor structure 201 on the middle, and a contact via 202 is manufactured.

Figure 3A:
Figure 3B:
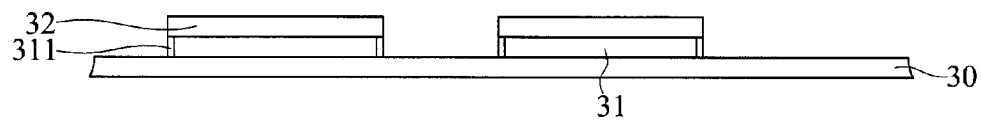
Figure 3C:
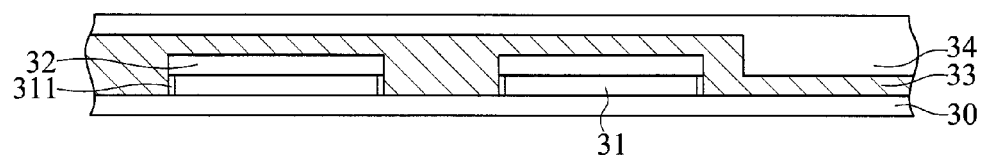
Figure 3D:
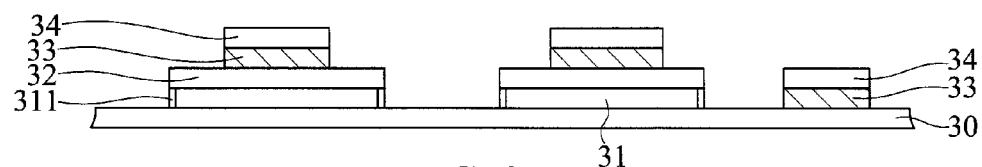
Figure 3E:
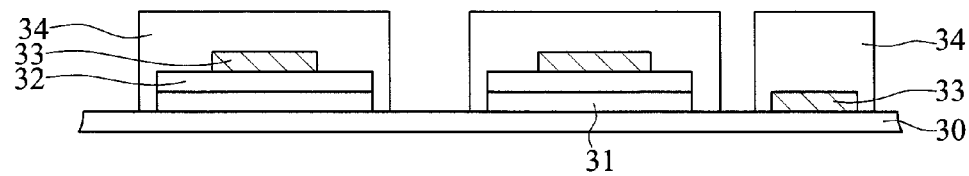
Figure 3F:
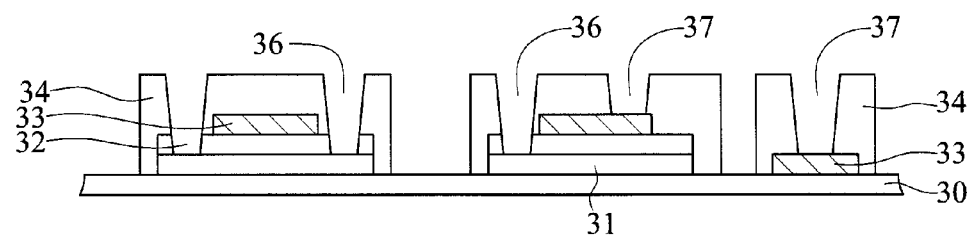

As shown in FIGS. 3A-3G, another embodiment of the method of manufacturing an electronic device according to the present disclosure is provided with a sectional view. FIGS. 3E and 3F illustrate two alternative processes of FIG. 3D. FIGS. 3I and 3J illustrates different embodiments of FIG. 3H. In this embodiment, for example, four PEPs are performed.

As shown in FIG. 3A, a semiconductor layer 31 and an insulating layer 32 are formed on a substrate 30, and the semiconductor layer 31 and the insulating layer 32 are patterned through PEP1 such that the semiconductor layer 31 and the insulating layer 32 have corresponding patterns. Optionally, as shown in FIG. 3B, after the PEP1 is performed, a surface treatment layer 311 is further formed on a portion of the semiconductor layer 31 that is not covered by the insulating layer 32. The surface treatment layer 311 may be formed by $N_2O$ plasma, $O_3$ gas treatment, ozone water, thermal annealing, or a combination thereof. It should be appreciated to persons skilled in the art that although the surface treatment layer 311 is illustrated in the following FIGS. 3C to 3H, as mentioned above, the formation of the surface treatment layer 311 is optional and is not required. In other words, in an embodiment, the surface treatment layer 311 can be omitted.

As shown in FIG. 3C, a first metal layer 33 and a protection layer 34 are formed on the insulating layer 32 and the substrate 30, where the protection layer 34 is not necessary and can be omitted in some embodiments. The protection layer 34 may be made of dielectric oxide, nitride, or carbide material system, such as SiOx, SiNx, SiCO, AlOx or TiOx. Alternately, the protection layer 34 may be a multi-layer stack structure constructed by the aforesaid dielectric materials. In an embodiment, the semiconductor layer 31, the insulating layer 32, the first metal layer 33, and the protection layer 34 may be formed by a deposition or a coating process.

In an embodiment, the semiconductor layer 31 may be made of silicon based materials such as amorphous-Si, polycrystalline silicon, or oxide semiconductor (for example, InGaZnO (IGZO) system, InSnO (ITO) system, InZnO (IZO) system, or InSnZnO (ITZO) system). The semiconductor layer 31 may also be made of other semiconductor system containing oxygen, or organic semiconductor such as pentacene, poly(3-hexyl thiophene) (P3HT), and the like. The insulating layer 32 may be made of insulating materials such as SiOx, SiNx, SiON or other suitable insulating materials. Alternately, the insulating layer 32 may be a multi-layer stack structure constructed by the aforesaid insulating materials. The first metal layer 33 may be formed of conductive materials, such as Mo, Al, Ti, Cu, or alloy materials thereof. Alternately, the first metal layer 33 may be a multi-layer stack structure constructed by the conductive materials.

As shown in FIG. 3D, the first metal layer 33 and the protection layer 34 are patterned through PEP2 such that the first metal layer 33 and the protection layer 34 have corresponding patterns. In an embodiment, the semiconductor layer 31 has a region larger than a region of the first metal layer 33.

Figure 3G:
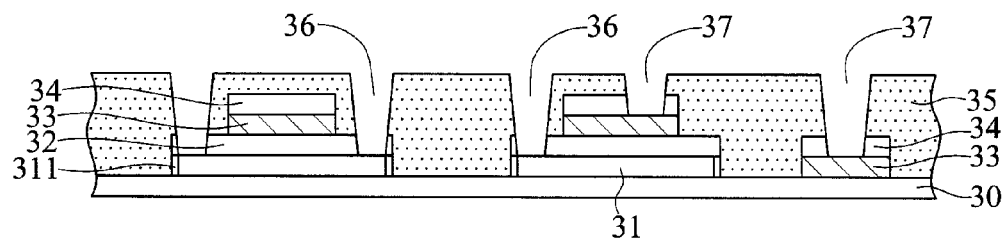

As shown in FIG. 3G, a flexible layer 35 is formed on the substrate 30 and patterned through PEP3, so as to encapsulate the semiconductor layer 31, the insulating layer 32, the first metal layer 33, and the protection layer 34. In an embodiment, the flexible layer 35 has a Young's modulus less than 40 GPa.

At least one first opening 36 is formed to penetrate the flexible layer 35 and the insulating layer 32, such that a portion of the semiconductor layer 31 is exposed. In an embodiment, at least one second opening 37 is formed to penetrate the flexible layer 35 and the protection layer 34, such that a portion of the first metal layer 33 is exposed. The flexible layer 15 may be formed by material such as organic material system (e.g., polyimide or the likes) or spin-on-glass (SOG) system.

Figure 3H:
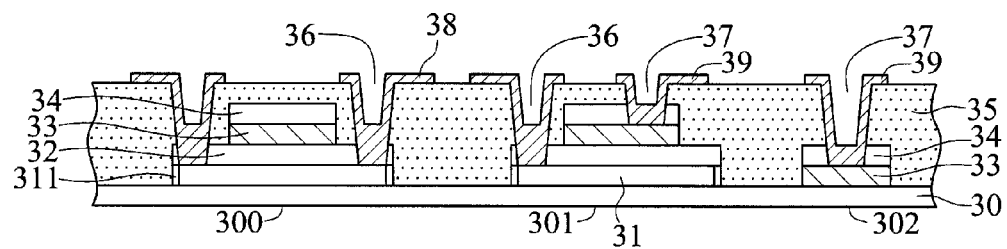
Figure 3I:
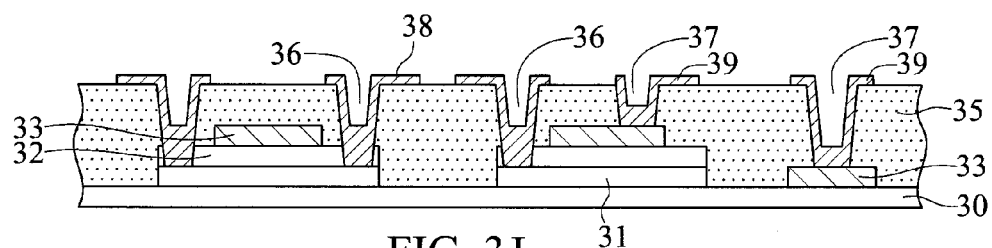
FIGS. 3I and 3J are sectional views of variations of the electronic device shown in FIG. 3F.
Figure 3J:
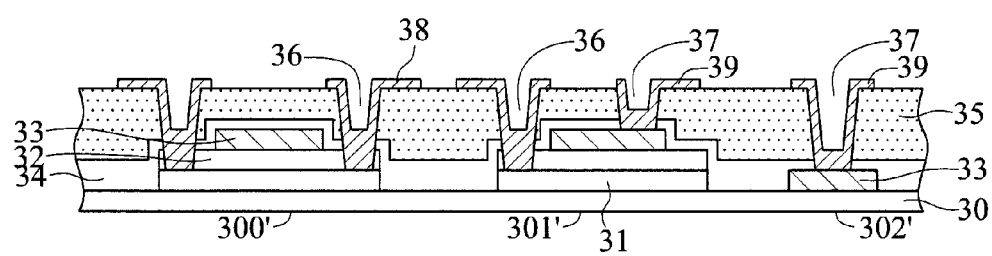

As shown in FIG. 3H, at least one second metal layer 38 is formed on the flexible layer 35 and in the first opening 36, and at least one third metal layer 39 is formed on the flexible layer 35 and in the second opening 37 through PEP4, so as to electrically connect the semiconductor layer 31 and the first metal layer 33, respectively. In an embodiment, the second metal layer 38 and the third metal layer 39 may be formed by a deposition or a coating process. In this embodiment, an electronic device having a top-gate thin film transistor (TFT) 300 on the left, a capacitor structure 301 on the middle, and a contact via 302 is manufactured.

In another embodiment, as shown in FIG. 3I, if the subsequent process will not influence the first metal layer 33, the protection layer 34 can be omitted.

In a further embodiment, as show in FIG. 3J, the protection layer 34 is formed after the PEP2 illustrated in FIG. 3D is performed, such that the protection layer 34 encapsulates the semiconductor layer 31, the insulating layer 32, and the first metal layer 33. In this embodiment, the first opening 36 further penetrates the protection layer 34. Since the protection layer 34 is not patterned with the first metal layer 33 in PEP2, an additional PEP3 for the protection layer 34 is performed, as shown in FIG. 3E. Therefore, this embodiment includes five photo engraving processes. Optionally, the first opening 36 and the second opening 37 may be formed while patterning the protection layer 34 in the additional PEP3, as shown in FIG. 3F. In this embodiment, an electronic device having a top-gate thin film transistor (TFT) 300' on the left, a capacitor structure 301' on the middle, and a contact via 302' is manufactured, where the protection layer 34 may encapsulate one or more electronic components, such as the top-gate TFT 300' or the capacitor structure 301' and the likes.

As shown in FIGS. 4A-4H, another embodiment of the method of manufacturing an electronic device according to the present disclosure is provided with a sectional view. In this embodiment, for example, six PEPs are performed.

Figure 4A:
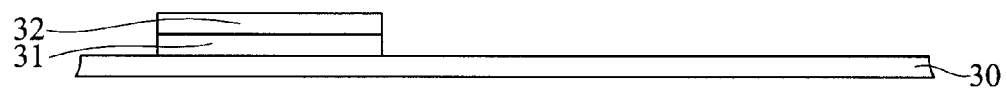

As shown in FIG. 4A, a semiconductor layer 31 and an insulating layer 32 are formed on a substrate 30, and the semiconductor layer 31 and the insulating layer 32 are patterned through PEP1, such that the semiconductor layer 31 and the insulating layer 32 are disposed on a left portion of the substrate 30, for example, and have corresponding patterns.

Figure 4B:
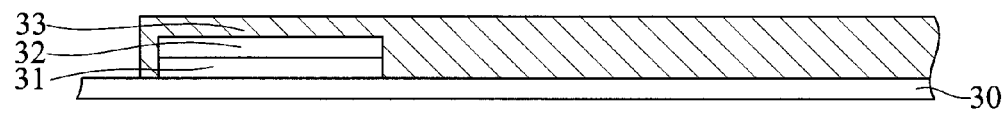

As shown in FIG. 4B, a first metal layer 33 is formed on the insulating layer 32 and the substrate 30.

Figure 4C:
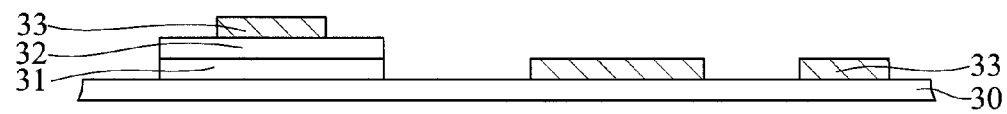

As shown in FIG. 4C, the first metal layer 33 is patterned through PEP2.

Figure 4D:
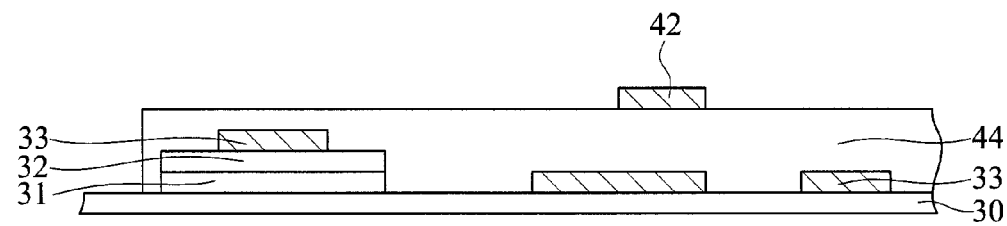

As shown in FIG. 4D, a first protection layer 44 is formed to encapsulate the semiconductor layer 31, the insulating layer 32, and the first metal layer 33. A fourth metal layer 42 is formed on the first protection layer 44 and is patterned through PEP3. In an embodiment, the patterned fourth metal layer 42 is above a middle portion of the substrate 30 where the semiconductor layer 31 and the insulating layer 32 are not formed thereon, so as to construct, for example, a capacitor structure.

Figure 4E:
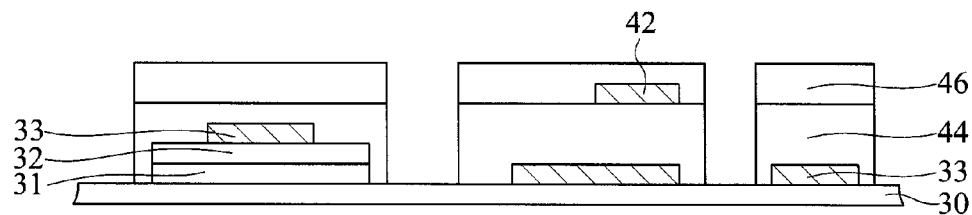

As shown in FIG. 4E, a second protection layer 46 is formed on the first protection layer 44 to encapsulate the fourth metal layer 42. The first protection layer 44 and the second protection layer 46 are patterned through PEP4.

Figure 4F:
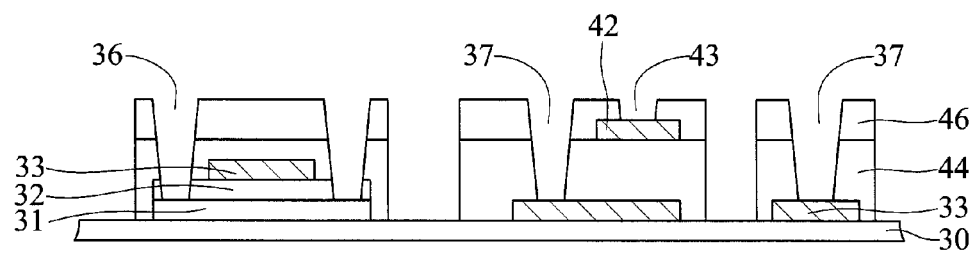

Optionally, at least one first opening 36, at least one second opening 37 and at least one third opening 43 may be formed in the PEP4, so as to expose a portion of the semiconductor layer 31, the first metal layer 33 and the fourth metal layer 42, respectively (see FIG. 4F). In an embodiment, the first opening 36, the second opening 37, and the third opening 43 may be formed in a subsequent process.

Figure 4G:
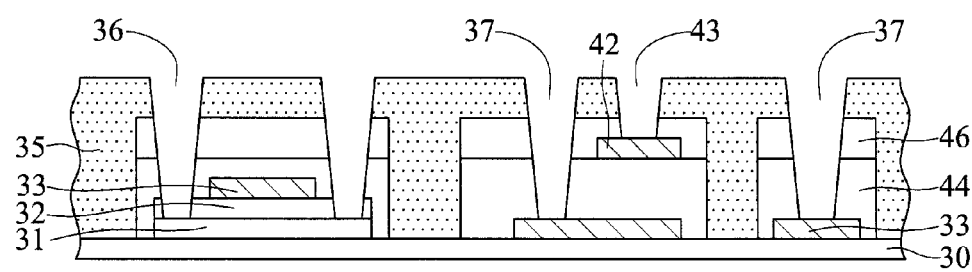

As shown in FIG. 4G, a flexible layer 35 is formed on the substrate 30 and is patterned through PEP5. If the first opening 36, the second opening 37, and the third opening 43 are not formed in the PEP4, may be formed in the PEP5, so as to expose a portion of the semiconductor layer 31, the first metal layer 33 and the fourth metal layer 42, respectively.

Figure 4H:
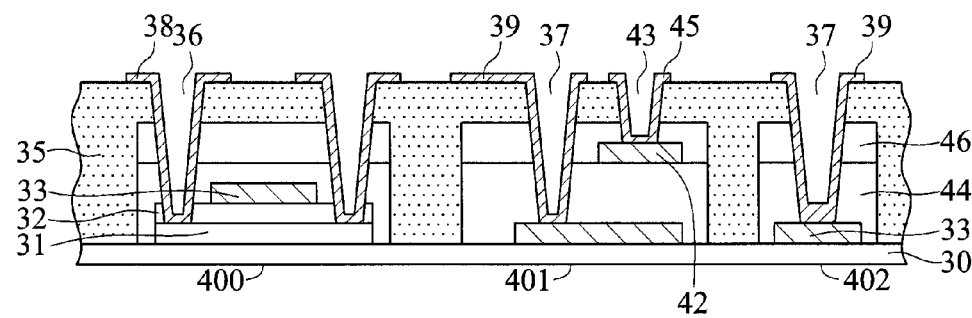

As shown in FIG. 4H, at least one second metal layer 38 is formed on the flexible layer 35 and in the first opening 36, at least one third metal layer 39 is formed on the flexible layer 35 and in the second opening 37, and at least one fifth metal layer 45 is formed on the flexible layer 35 and in the third opening 43 through PEP6, so as to electrically connect the semiconductor layer 31, the first metal layer 33, and the fourth metal layer 42, respectively. In this embodiment, an electronic device having a top-gate thin film transistor (TFT) 400 on the left, a capacitor structure 401 on the middle, and a contact via 402 is manufactured.

Figure 5A:
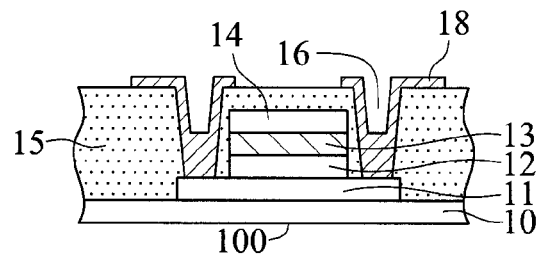
FIGS. 5A and 5B illustrate sectional views of two embodiments of electronic devices manufactured by the method illustrated in FIGS. 1G and 3H of the present disclosure, respectively.
Figure 5B:
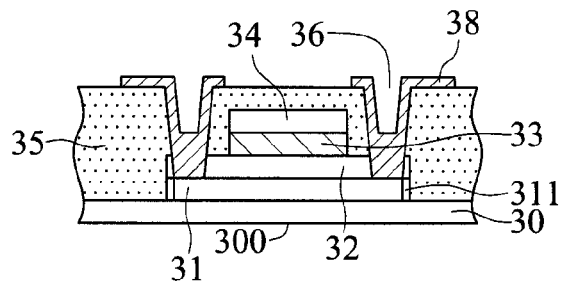

As shown in FIGS. 5A and 5B, sectional views of two embodiments of electronic devices manufactured by the method illustrated in FIGS. 1G and 3H of the present disclosure, respectively are illustrated.

As shown in FIG. 5A, a semiconductor layer 11 is disposed on a substrate 10, and an insulating layer 12, a first metal layer 13, and a protection layer 14 are disposed on the semiconductor layer 11. The insulating layer 12, the first metal layer 13, and the protection layer 14 have corresponding patterns. The protection layer 14 is not necessary, and may be omitted in some embodiments. A flexible layer 15 is disposed on the substrate 10 to encapsulate the semiconductor layer 11, the insulating layer 12, the first metal layer 13, and the protection layer 14. In an embodiment, the flexible layer 15 has a Young's modulus less than 40 GPa. At least one first opening 16 is formed to penetrate the flexible layer 15, and at least one second metal layer 18 is disposed on the flexible layer 15 and in the first opening 16 to electrically connect the semiconductor layer 11.

As shown in FIG. 5B, a semiconductor layer 31 and an insulating layer 32 are disposed on a substrate 30, and the semiconductor layer 31 and the insulating layer 32 have corresponding peripheral patterns. Optionally, a surface treatment layer 311 is further formed on a portion of the semiconductor layer 31 that is not covered by the insulating layer 32. A first metal layer 33 and a protection layer 34 are disposed on the insulating layer 32, and have corresponding patterns. The protection layer 34 is not necessary, and may be omitted in some embodiments. A flexible layer 35 is disposed on the substrate 30 to encapsulate the semiconductor layer 31, the insulating layer 32, the first metal layer 33, and the protection layer 34. In an embodiment, the flexible layer 35 has a Young's modulus less than 40 GPa. At least one first opening 36 is formed to penetrate the flexible layer 35 and the insulating layer 32, and at least one second metal layer 38 is disposed on the flexible layer 35 and in the first opening 36 to electrically connect the semiconductor layer 31.

In an embodiment, the semiconductor layer 31 may be made of silicon based materials such as amorphous-Si, polycrystalline silicon, or oxide semiconductor (for example, InGaZnO (IGZO) system, InSnO (ITO) system, InZnO (IZO) system, or InSnZnO (ITZO) system). The semiconductor layer 31 may also be made of other semiconductor system containing oxygen, or organic semiconductor, such as pentacene, poly(3-hexyl thiophene) (P3HT), and the like. The insulating layer 32 may be made of insulating materials such as SiOx, SiNx, SiON or other suitable insulating materials. Alternately, the insulating layer 32 may be a multi-layer stack structure constructed by the aforesaid insulating materials. The first metal layer 33 may be formed of conductive materials, such as Mo, Al, Ti, Cu, or alloy materials thereof. Alternately, the first metal layer 33 may be a multi-layer stack structure constructed by the conductive materials.

Figure 6A:
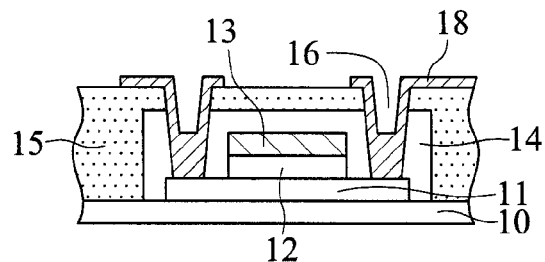
FIGS. 6A and 6B illustrate sectional views of two embodiments of electronic devices according to the present disclosure.
Figure 6B:
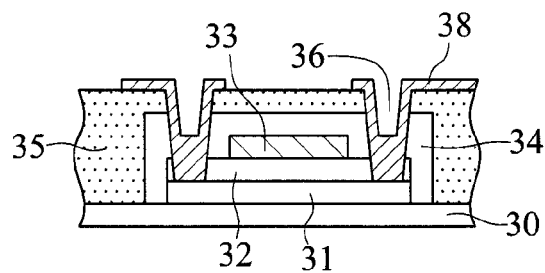

As shown in FIGS. 6A and 6B, sectional views of two embodiments of electronic devices according to the present disclosure.

As shown in FIG. 6A, a semiconductor layer 11 is disposed on a substrate 10, and an insulating layer 12 and a first metal layer 13 are disposed on the semiconductor layer 11 and have corresponding patterns. A protection layer 14 and a flexible layer 15 are disposed on the substrate 10, so as to encapsulate the semiconductor layer 11, the insulating layer 12 and the first metal layer 13. In an embodiment, the flexible layer 15 has a Young's modulus less than 40 GPa. At least one first opening 16 is formed to penetrate the flexible layer 15, and at least one second metal layer 18 is disposed on the flexible layer 15 and in the first opening 16 to electrically connect the semiconductor layer 11.

As shown in FIG. 6B, a semiconductor layer 31 and an insulating layer 32 are disposed on a substrate 30, and have corresponding peripheral patterns. A first metal layer 33 is then disposed on the insulating layer 32. A protection layer 34 and a flexible layer 35 are disposed on the substrate 30, so as to encapsulate the semiconductor layer 31, the insulating layer 32 and the first metal layer 33. In an embodiment, the flexible layer 35 has a Young's modulus less than 40 GPa. At least one first opening 36 is formed to penetrate the flexible layer 35 and the insulating layer 32, and at least one second metal layer 38 is disposed on the flexible layer 35 and in the first opening 36 to electrically connect the semiconductor layer 31.

As shown in FIGS. 7A to 7D, sectional views of four embodiments of electronic devices are illustrated.

Figure 7A:
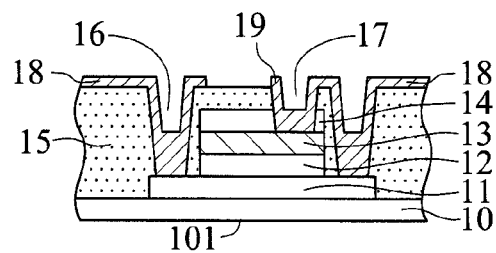
FIGS. 7A to 7D illustrate variations of the electronic devices shown in FIGS. 5A, 5B, 6A, and 6B, respectively.
Figure 7B:
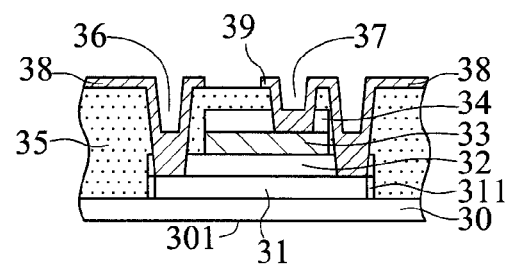
Figure 7C:
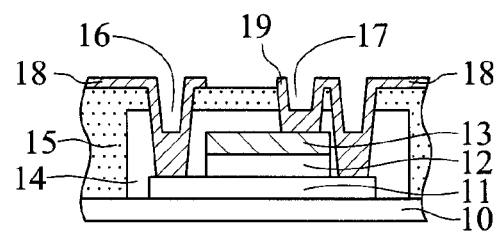
Figure 7D:
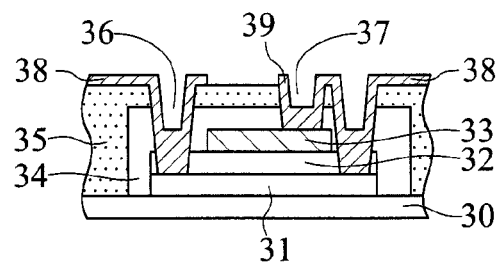

The electronic devices shown in FIGS. 7A to 7D are variations of the electronic devices shown in FIGS. 5A, 5B, 6A, and 6B, respectively. As shown in FIG. 7A, this embodiment is different from that shown in FIG. 5A by the follows. A second opening 17 is formed to penetrate the flexible layer 15 and the protection layer 14. Then, a third metal layer 19 is further disposed in the second opening 17 to electrically connect the first metal layer 13. Similarly, as shown in FIG. 7B, a second opening 37 is formed to penetrate the flexible layer 35 and the protection layer 34. Then, a third metal layer 39 is further disposed in the second opening 37 to electrically connect the first metal layer 33. As shown in FIG. 7C, this embodiment is different from that shown in FIG. 6A by the follows. A second opening 17 is formed to penetrate the protection layer 14 and the flexible layer 15. Then, a third metal layer 19 is further disposed in the second opening 17 to electrically connect the first metal layer 13. Similarly, as shown in FIG. 7D, a second opening 37 is formed to penetrate the protection layer 34 and the flexible layer 35. Then, a third metal layer 39 is further disposed in the second opening 37 to electrically connect the first metal layer 33. In an embodiment, one of the second metal layers 18, 38 on the flexible layer 15, 35 is electrically connected to the third metal layer 19, 39 on the flexible layer 15, 35.

Figure 8A:
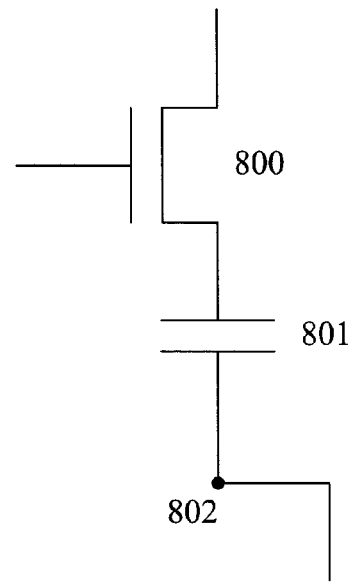
FIGS. 8A to 8C illustrate a circuit diagram and structural section views of two embodiments according to the electronic devices of the present disclosure, respectively.
Figure 8B:
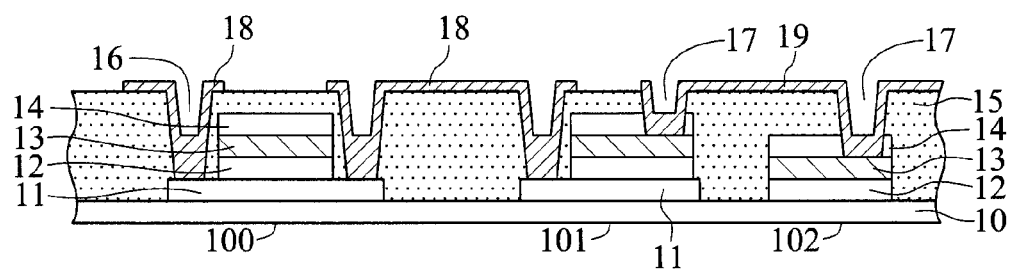
Figure 8C:
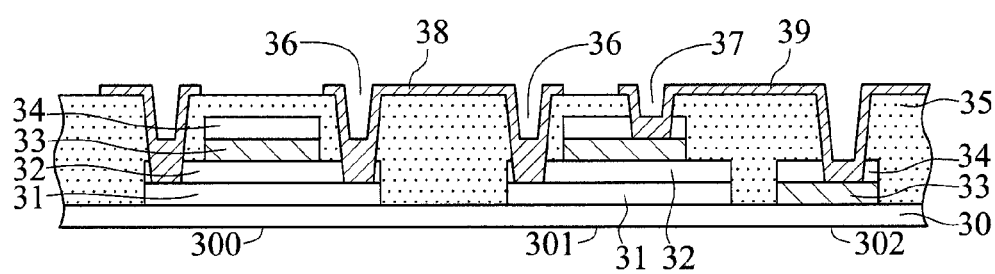

FIGS. 8A to 8C illustrate a circuit diagram and structural section views of two exemplary embodiments thereof according to the electronic device of the present disclosure, respectively.

As shown in FIG. 8A, an embodiment of the electronic device comprises a thin film transistor 800, a capacitor structure 801 and a contact via 802.

As shown in FIG. 8B, a contact via 102 comprises an insulating layer 12 disposed on a substrate 10, a first metal layer 13 disposed on the insulating layer 12, a protection layer 14 disposed on the first metal layer 13, and a flexible layer 15 encapsulating the insulating layer 12, the first metal layer 13, and the protection layer 14, a second opening 17 penetrates the flexible layer 15, and a third metal layer 19 is disposed in the second opening 17. In this embodiment, the electronic device comprises a top-gate TFT 100, a capacitor structure 101, and a contact via 102. In an embodiment, two ends of the second metal layers 18 of the top-gate TFT 100 and the capacitor structure 101 on the flexible layer 15 are electrically connected, respectively, and two ends of the third metal layers 19 of the capacitor structure 101 and the contact via 102 on the flexible layer 15 are electrically connected, respectively. In this embodiment, the first metal layer 13, the insulating layer 12 and the protection layer 14 have corresponding peripheral patterns, and preferably, the semiconductor layer 11 has a region larger than a region of the first metal layer 13 at least in one axial direction.

As shown in FIG. 8C, a contact via 302 comprises a first metal layer 33 disposed on a substrate 30, a protection layer 34 disposed on the first metal layer 33, and a flexible layer 35 encapsulating the first metal layer 33 and the protection layer 34. The flexible layer 35 is penetrated by a second opening 37 and a third metal layer 39 is disposed thereon. In this embodiment, the electronic device comprises a top-gate TFT 300, a capacitor structure 301, and a contact via 302. In an embodiment, two ends of the second metal layers 38 of the top-gate TFT 300 and the capacitor structure 301 on the flexible layer 35 are electrically connected, respectively, and two ends of the third metal layers 39 of the capacitor structure 301 and the contact via 302 on the flexible layer 35 are electrically connected, respectively. In this embodiment, the semiconductor layer 31 and the insulating layer 32 have corresponding peripheral patterns, and preferably, the semiconductor layer 31 has a region larger than a region of the first metal layer 33 at least in one axial direction.

Figure 9A:
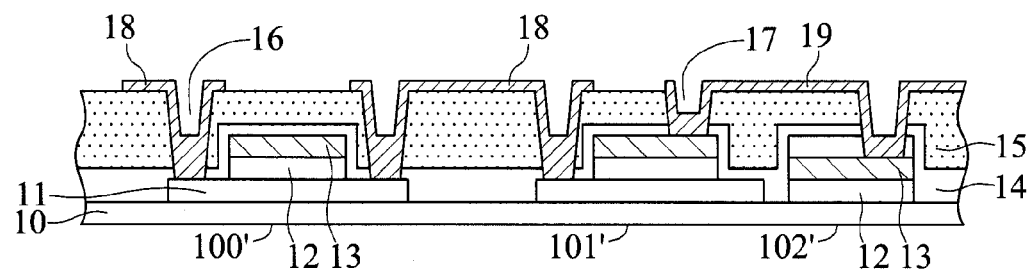
FIGS. 9A and 9B illustrate structural section views of two embodiments according to the electronic devices of the present disclosure, respectively.
Figure 9B:
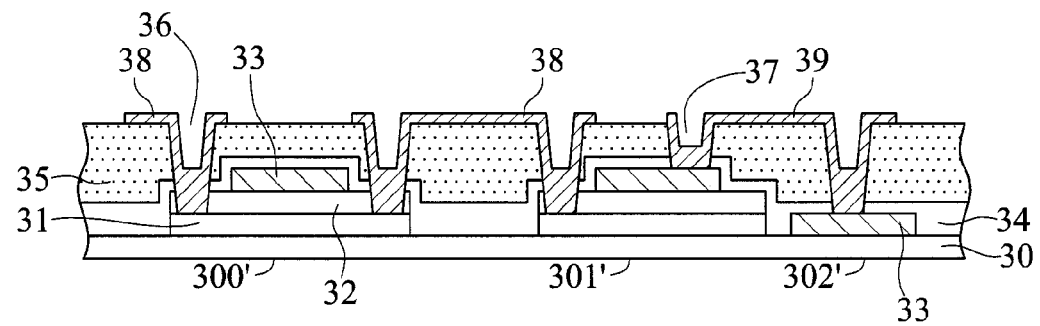

FIGS. 9A and 9B illustrate structural section views of two exemplary embodiments according to the electronic device of the present disclosure, respectively.

As shown in FIG. 9A, a contact via 102' comprises an insulating layer 12 disposed on a substrate 10, a first metal layer 13 disposed on the insulating layer 12, and a protection layer 14 and a flexible layer 15 encapsulating the insulating layer 12 and the first metal layer 13, where the protection layer 14 and the flexible layer 15 are penetrated by a second opening 17 and a third metal layer 19 is disposed thereon. In this embodiment, the electronic device comprises a top-gate TFT 100', a capacitor structure 101', and a contact via 102'. In an embodiment, two ends of the second metal layers 18 of the top-gate TFT 100' and the capacitor structure 101' on the flexible layer 15 are electrically connected, respectively, and two ends of the third metal layers 19 of the capacitor structure 101 and the contact via 102' on the flexible layer 15 are electrically connected, respectively. In this embodiment, the first metal layer 13 and the insulating layer 12 have corresponding patterns, and preferably, the semiconductor layer 11 has a region larger than a region of the first metal layer 13 at least in one axial direction. The protection layer 14 encapsulates the semiconductor layer 11, the insulating layer 12 and the first metal layer 13 after being patterned. In this embodiment, the protection layer 14 may encapsulate one or more electronic components, such as the top-gate TFT 100', the capacitor structure 101' and the likes. Alternately, the protection layer 14 may individually encapsulate different electronic components.

As shown in FIG. 9B, a contact via 302' comprises a first metal layer 33 disposed on a substrate 30, and a protection layer 34 and a flexible layer 35 encapsulating the first metal layer 33. The protection layer 34 and the flexible layer 35 are penetrated by a second opening 37 and a third metal layer 39 is disposed thereon. In this embodiment, the electronic device comprises a top-gate TFT 300', a capacitor structure 301', and a contact via 302'. In an embodiment, two ends of the second metal layers 38 of the top-gate TFT 300' and the capacitor structure 301' on the flexible layer 35 are electrically connected, respectively, and two ends of the third metal layers 39 of the capacitor structure 301' and the contact via 302' on the flexible layer 35 are electrically connected, respectively. In this embodiment, the semiconductor layer 31 and the insulating layer 32 have corresponding peripheral patterns, and preferably, the semiconductor layer 31 has a region larger than a region of the first metal layer 33 at least in one axial direction. The protection layer 34 encapsulates the semiconductor layer 31, the insulating layer 32 and the first metal layer 33 after being patterned. In this embodiment, the protection layer 34 may encapsulate one or more electronic components, such as the top-gate TFT 300', the capacitor structure 301' and the likes. Alternately, the protection layer 34 may individually encapsulate different electronic components.

Figure 10A:
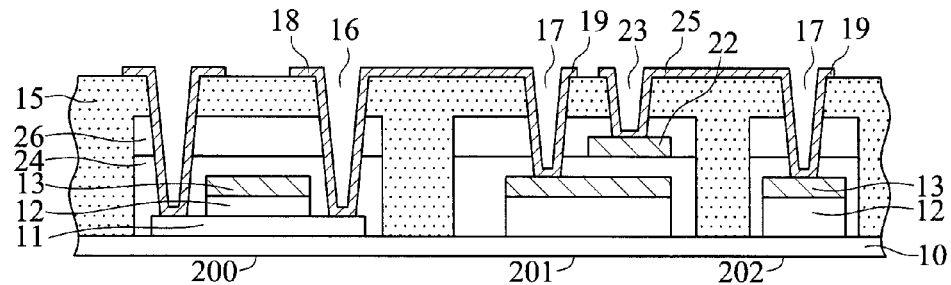
FIGS. 10A to 10C illustrate structural side views of three embodiments according to the electronic devices of the present disclosure, respectively.
Figure 10B:
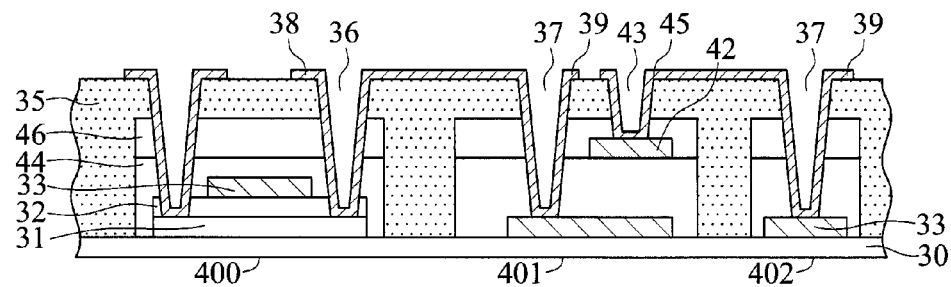
Figure 10C:
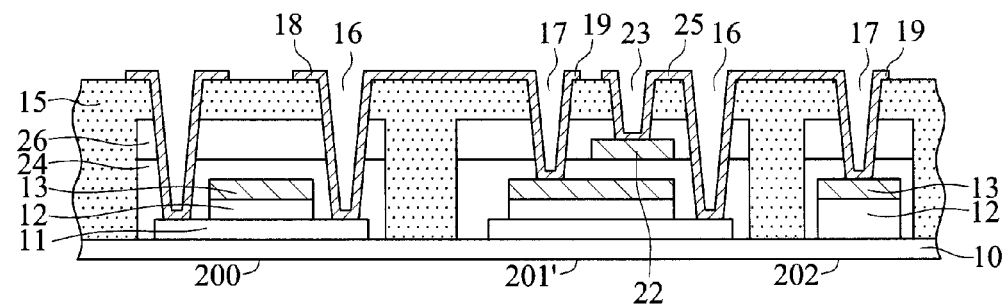

FIGS. 10A to 10C illustrate structural section views of three further exemplary embodiments according to the electronic device of the present disclosure, respectively.

As shown in FIG. 10A, a capacitor structure 201 comprises an insulating layer 12 disposed on a substrate 10, a first metal layer 13 disposed on the insulating layer 12, a first protection layer 24 encapsulating the insulating layer 12 and the first metal layer 13, a fourth metal layer 22 disposed on a portion of the first protection layer 24, a second protection layer 26 encapsulating the fourth metal layer 22, and a flexible layer 15 encapsulating the first protection layer 24 and the second protection layer 26, where the first protection layer 24, the second protection layer 26 and the flexible layer 15 are penetrated by a second opening 17 and a third metal layer 19 is disposed thereon, in addition, the second protection layer 26 and the flexible layer 15 are further penetrated by a third opening 23 and a fifth metal layer 25 is disposed thereon.

As shown in FIG. 10A, a contact via 202 comprises an insulating layer 12 disposed on a substrate 10, a first metal layer 13 disposed on the insulating layer 12, a first protection layer 24 and a second protection layer 26 encapsulating the insulating layer 12 and the first metal layer 13, and a flexible layer 15 encapsulating the first protection layer 24 and the second protection layer 26, where the first protection layer 24, the second protection layer 26 and the flexible layer 15 are penetrated by a second opening 17 and a third metal layer 19 is disposed thereon. In this embodiment, the electronic device comprises a top-gate TFT 200, a capacitor structure 201, and a contact via 202. In an embodiment, one end of the second metal layer 18 of the top-gate TFT 200 and one end of the third metal layer 19 of the capacitor structure 201 on the flexible layer 15 are electrically connected, respectively, and one end of the fifth metal layer 25 of the capacitor structure 201 and one end of the third metal layer 19 of the contact via 202 on the flexible layer 15 are electrically connected, respectively. In this embodiment, the first metal layer 13 and the insulating layer 12 have corresponding patterns, and the first protection layer 24 and the second protection layer 26 have corresponding peripheral patterns. In an embodiment, the semiconductor layer 11 has a region larger than a region of the first metal layer 13 at least in one axial direction. The first protection layer 24 and the second protection layer 26 encapsulate the semiconductor layer 11, the insulating layer 12, the first metal layer 13, and the fourth metal layer 22 after being patterned.

As shown in FIG. 10B, a capacitor structure 401 comprises a first metal layer 33 disposed on a substrate 30, a first protection layer 44 encapsulating the first metal layer 33, a fourth metal layer 42 disposed on a portion of the first protection layer 44, and a second protection layer 46 encapsulating the fourth metal layer 42, and a flexible layer 35 encapsulating the first protection layer 44 and the second protection layer 46, where the first protection layer 44, the second protection layer 46 and the flexible layer 35 are penetrated by a second opening 37 and a third metal layer 39 is disposed thereon, in addition, the second protection layer 46 and the flexible layer 35 are further penetrated by a third opening 43 and a fifth metal layer 45 is disposed thereon.

As shown in FIG. 10B, a contact via 402 comprises a first metal layer 33 disposed on a substrate 30, a first protection layer 44 and a second protection layer 46 encapsulating the first metal layer 33, and a flexible layer 35 encapsulating the first protection layer 44 and the second protection layer 46, where the first protection layer 44, the second protection layer 46 and the flexible layer 35 are penetrated by a second opening 37 and a third metal layer 39 is disposed thereon. In this embodiment, the electronic device comprises a top-gate TFT 400, a capacitor structure 401, and a contact via 402. In an embodiment, one end of the second metal layer 38 of the top-gate TFT 400 and one end of the third metal layer 39 of the capacitor structure 401 on the flexible layer 35 are electrically connected, respectively, and one end of the fifth metal layer 45 of the capacitor structure 401 and one end of the third metal layer 39 of the contact via 402 on the flexible layer 35 are electrically connected, respectively. In this embodiment, the semiconductor layer 31 and the insulating layer 32 have corresponding peripheral patterns, and the first protection layer 44 and the second protection layer 46 have corresponding peripheral patterns. In an embodiment, the semiconductor layer 31 has a region larger than a region of the first metal layer 33 at least in one axial direction. The first protection layer 44 and the second protection layer 46 encapsulate the semiconductor layer 31, the insulating layer 32, the first metal layer 33, and the fourth metal layer 42 after being patterned.

FIG. 10C illustrates a double layer capacitor structure 201', which is a variation of the capacitor structure 201 shown in FIG. 10A. In this embodiment, a semiconductor layer 11 is formed between the substrate 10 and the insulating layer 12, and a first opening 16 with second metal layer 18 is formed in the double layer capacitor structure 201' for electrically connecting the semiconductor layer 11. Further, in an embodiment, on the flexible layer 15, two ends of the second metal layer 18 of the double layer capacitor structure 201' are electrically connected to one end of the fifth metal layer 25 of the double layer capacitor structure 201' and to one end of the third metal layer 19 of the contact via 202, respectively.

In an embodiment, the electronic device comprises a TFT, capacitor, resistor, inductor, contact via, diode, memory, antenna, or the like. The connection relationships between various electronic components can be modified and is not limited in abovementioned manners.

The present disclosure provides various embodiments using a flexible layer, for instance an organic material, to separate and encapsulate transistors, capacitors and/or contact vias, so as to achieve an efficacy of stress distribution. Therefore, the electronic devices of the present disclosure provide improved flexibility. Further, the electrical structure of an embodiment according to the present disclosure is an inorganic material, may ensure a better electrical characteristics. In addition, an embodiment of the present disclosure provides a method of manufacturing electronic components with less photo engraving processes, so as to effectively save time and cost of manufacture.

It is clear that various modifications and variations can be made to the disclosed embodiments. It is intended that the specification and examples be considered as exemplary only, with a true scope of the disclosure being indicated by the following claims and their equivalents.

What is claimed is:

1. An electronic device including at least one electronic components, comprising:
   a substrate;
   a semiconductor layer disposed on the substrate;
   an insulating layer disposed on the semiconductor layer;
   a first metal layer disposed on the insulating layer and having a pattern corresponding to a pattern of the insulating layer;
   a flexible layer disposed on the substrate and encapsulating the semiconductor layer, the insulating layer and the first metal layer;
   at least one first opening penetrating the flexible layer;
   at least one second metal layer disposed on the flexible layer and in the at least one first opening and electrically connected to the semiconductor layer, and
   a protection layer disposed on the first metal layer and encapsulating the semiconductor layer, the insulating layer, and the first metal layer, so as to encapsulate at least one electronic component, wherein the at least one first opening further penetrates the protection layer.

2. The electronic device of claim 1, wherein the semiconductor layer has a region larger than a region of the first metal layer.

3. The electronic device of claim 1, further comprising a buffer layer disposed between the substrate and the semiconductor layer.

4. The electronic device of claim 1, further comprising a protection layer disposed on the first metal layer and having a pattern corresponding to the pattern of the first metal layer, wherein the flexible layer further encapsulates the protection layer.

5. The electronic device of claim 1, further comprising a fourth metal layer disposed on the protection layer, and another protection layer encapsulating the fourth metal layer.

6. The electronic device of claim 1, further comprising a second opening penetrating the flexible layer, and a third metal layer disposed in the second opening and electrically connected to the first metal layer.

7. The electronic device of claim 6, wherein one of the second metal layers on the flexible layer of one of the plurality of electronic components is electrically connected to the third metal layer on the flexible layer of another one of the plurality of electronic components.

8. The electronic device of claim 7, further comprising a protection layer disposed on the first metal layer, wherein the second opening further penetrates the protection layer.

9. The electronic device of claim 1, wherein the flexible layer has a Young's modulus less than 40 GPa.

10. An electronic device including at least one electronic components, comprising:
    a substrate;

a semiconductor layer disposed on the substrate;

an insulating layer disposed on the semiconductor layer and having a peripheral pattern corresponding to a peripheral pattern of the semiconductor layer;

a first metal layer disposed on the insulating layer;

a flexible layer disposed on the substrate and encapsulating the semiconductor layer, the insulating layer and the first metal layer;

at least one first opening penetrating the flexible layer and the insulating layer;

at least one second metal layer disposed on the flexible layer and in the at least first opening and electrically connected to the semiconductor layer; and a protection layer disposed on the first metal layer and encapsulating the semiconductor layer, the insulating layer, and the first metal layer, so as to encapsulate at least one electronic component, wherein the at least one first opening further penetrates the protection layer.

11. The electronic device of claim 10, wherein the semiconductor layer has a region larger than a region of the first metal layer.

12. The electronic device of claim 10, further comprising a buffer layer disposed between the substrate and the semiconductor layer.

13. The electronic device of claim 10, further comprising a protection layer disposed on the first metal layer having a pattern corresponding to the first metal layer.

14. The electronic device of claim 10, further comprising a fourth metal layer disposed on the protection layer, and another protection layer encapsulating the fourth metal layer.

15. The electronic device of claim 10, further comprising a second opening penetrating the flexible layer and exposing the first metal layer, and a third metal layer disposed in the second opening and electrically connected to the first metal layer.

16. The electronic device of claim 15, wherein one of the second metal layers on the flexible layer of one of the plurality of electronic components is electrically connected to the third metal layer on the flexible layer of another one of the plurality of electronic components.

17. The electronic device of claim 16, further comprising a protection layer disposed on the first metal layer, wherein the second opening further penetrates the protection layer.

18. The electronic device of claim 10, wherein the flexible layer has a Young's modulus less than 40 GPa.

19. A method of manufacturing an electronic device including at least one electronic component, comprising:

forming a semiconductor layer on a substrate;

forming an insulating layer on the semiconductor layer;

forming a first metal layer on the insulating layer;

performing a patterning process such that the insulating layer has a pattern corresponding to a pattern of one of the first metal layer and the semiconductor layer;

forming a flexible layer on the substrate, wherein the flexible layer encapsulates the semiconductor layer, the insulating layer and the first metal layer;

forming at least one first opening exposing a portion of the semiconductor layer;

forming at least one second metal layer on the flexible layer and in the at least one first opening and electrically connected to the semiconductor layer; and forming a protection layer on the first metal layer, wherein the protection layer encapsulates the semiconductor layer, the insulating layer, and the first metal layer, so as to encapsulate at least one electronic component, and wherein the at least one first opening further penetrates the protection layer.

20. The method of claim 19, further comprising forming a buffer layer between the substrate and the semiconductor layer.

21. The method of claim 19, further comprising forming a protection layer on the first metal layer, wherein performing the patterning process further comprises patterning the protection layer such that the protection layer and the first metal layer have corresponding patterns.

22. The method of claim 19, further comprising forming a fourth metal layer on the protection layer, and encapsulating the fourth metal layer with another protection layer.

23. The method of claim 19, further comprising forming a second opening penetrating the flexible layer and exposing the first metal layer, and forming a third metal layer in the second opening and electrically connecting the third metal layer to the first metal layer.

24. The method of claim 23, further comprising electrically connecting one of the second metal layers on the flexible layer of one electronic component to the third metal layer on the flexible layer of another electronic component.

25. The method of claim 24, further comprising forming a protection layer on the first metal layer, wherein the second opening further penetrates the protection layer.

26. The method of claim 19, wherein the flexible layer has a Young's modulus less than 40 GPa.

* * * * *